United States Patent
Mochizuki et al.

(10) Patent No.: US 8,785,873 B2
(45) Date of Patent: Jul. 22, 2014

(54) DETECTION APPARATUS, METHOD OF MANUFACTURING THE SAME, AND DETECTION SYSTEM

(75) Inventors: Chiori Mochizuki, Sagamihara (JP); Minoru Watanabe, Honjo (JP); Takamasa Ishii, Honjo (JP); Jun Kawanabe, Kodama-gun (JP); Kentaro Fujiyoshi, Kumagaya (JP)

(73) Assignee: Canon Kabushiki Kaisha, Tokyo (JP)

( * ) Notice: Subject to any disclaimer, the term of this patent is extended or adjusted under 35 U.S.C. 154(b) by 693 days.

(21) Appl. No.: 13/049,975

(22) Filed: Mar. 17, 2011

(65) Prior Publication Data

US 2011/0248176 A1    Oct. 13, 2011

(30) Foreign Application Priority Data

Apr. 13, 2010   (JP) ................................. 2010-092626
Feb. 14, 2011   (JP) ................................. 2011-029087

(51) Int. Cl.
*G01T 1/20* (2006.01)

(52) U.S. Cl.
USPC ............ 250/370.14; 250/370.11; 250/370.01; 250/370.08

(58) Field of Classification Search
USPC ................................................... 250/370.14
See application file for complete search history.

(56) References Cited

U.S. PATENT DOCUMENTS

| | | | |
|---|---|---|---|
| 4,857,751 A | 8/1989 | Hatanaka et al. ............. 250/578 |
| 5,073,828 A | 12/1991 | Yamada et al. ................ 358/482 |
| 5,262,649 A * | 11/1993 | Antonuk et al. ......... 250/370.09 |
| 5,680,229 A | 10/1997 | Yamanobe et al. ........... 358/482 |
| 5,994,157 A * | 11/1999 | Aggas et al. .................... 438/30 |
| 6,020,590 A * | 2/2000 | Aggas et al. ............. 250/370.09 |
| 6,069,393 A | 5/2000 | Hatanaka et al. ............. 257/434 |
| 6,295,142 B1 | 9/2001 | Watanabe et al. ............. 358/482 |
| 6,380,493 B1 | 4/2002 | Morita et al. .................. 174/258 |

(Continued)

FOREIGN PATENT DOCUMENTS

| | | |
|---|---|---|
| CN | 1294482 A | 5/2001 |
| CN | 101218680 A | 7/2008 |

(Continued)

OTHER PUBLICATIONS

Russian Office Action dated Jun. 1, 2012, in related corresponding Russian Patent Application No. 2011114300 (with English translation).

(Continued)

*Primary Examiner* — David Porta
*Assistant Examiner* — Djura Malevic
(74) *Attorney, Agent, or Firm* — Fitzpatrick, Cella, Harper & Scinto

(57) ABSTRACT

A detection apparatus comprising a substrate; a switching element arranged over the substrate and including a plurality of electrodes; a conductive line arranged over the substrate and electrically connected to a first electrode of the plurality of electrodes of the switching element; and a conversion element including a semiconductor layer arranged over the switching element and the conductive line and arranged between two electrodes, one electrode of the two electrodes being electrically connected to a second electrode of the plurality of electrodes of the switching element, is provided. The one electrode of the conversion element is arranged over the switching element and the conductive line through a space formed between the one electrode and the first electrode of the switching element or between the one electrode and the conductive line.

11 Claims, 10 Drawing Sheets

(56) References Cited

U.S. PATENT DOCUMENTS

| | | | |
|---|---|---|---|
| 6,600,158 B1 | 7/2003 | Okada et al. | 250/370.11 |
| 6,847,039 B2* | 1/2005 | Mochizuki | 250/370.09 |
| 7,126,127 B2 | 10/2006 | Watanabe et al. | 250/370.01 |
| 7,214,945 B2* | 5/2007 | Nomura et al. | 250/370.08 |
| 7,282,719 B2 | 10/2007 | Mochizuki et al. | 250/370.14 |
| 7,368,724 B2* | 5/2008 | Morii et al. | 250/370.01 |
| 7,468,531 B2 | 12/2008 | Watanabe et al. | 257/291 |
| 7,521,684 B2* | 4/2009 | Nomura et al. | 250/370.09 |
| 7,573,037 B1 | 8/2009 | Kameshima et al. | 250/370.09 |
| 7,855,371 B2* | 12/2010 | Okada | 250/370.09 |
| 8,067,743 B2* | 11/2011 | Ishii et al. | 250/370.09 |
| 8,368,027 B2* | 2/2013 | Ishii et al. | 250/370.08 |
| 8,541,750 B2* | 9/2013 | Chen et al. | 250/370.11 |
| 2003/0226974 A1 | 12/2003 | Nomura et al. | 250/370.11 |
| 2007/0045554 A1* | 3/2007 | Wakamatsu et al. | 250/370.11 |
| 2009/0250699 A1 | 10/2009 | Okada | |
| 2010/0294942 A1 | 11/2010 | Mochizuki et al. | 250/366 |
| 2011/0006191 A1 | 1/2011 | Watanabe et al. | 250/208.1 |

FOREIGN PATENT DOCUMENTS

| | | |
|---|---|---|
| CN | 101682687 A | 3/2010 |
| JP | 2004-015002 A | 1/2004 |
| RU | 2006-131298 A | 3/2008 |
| WO | 2007/013570 A1 | 2/2007 |
| WO | 2007/142342 A1 | 12/2007 |

OTHER PUBLICATIONS

European Search Report in European Application No. EP 11 158 404.1 issued Oct. 11, 2013 (6 pages).

* cited by examiner

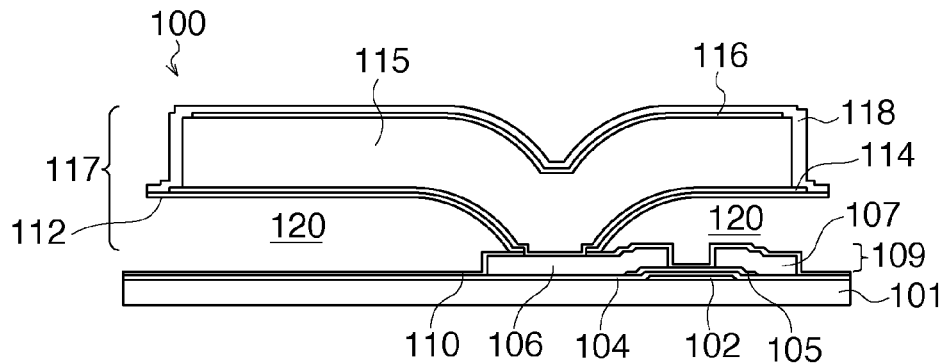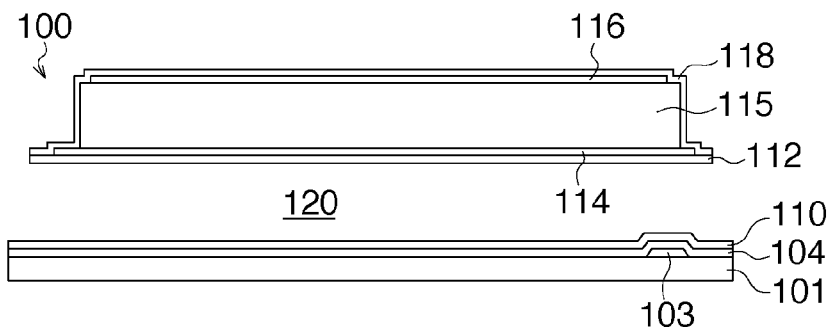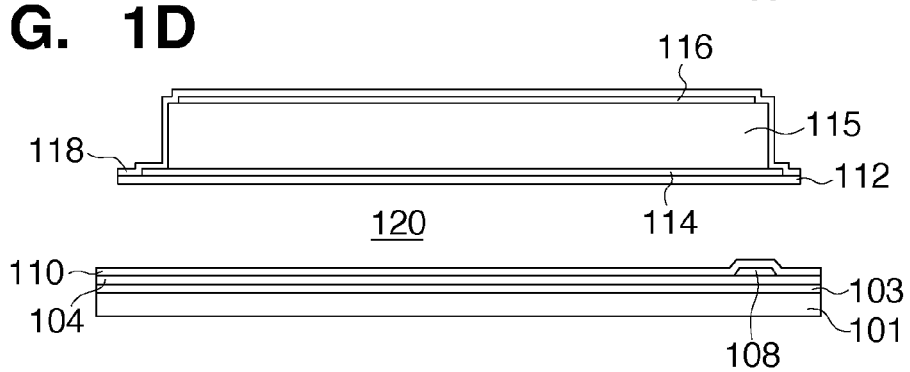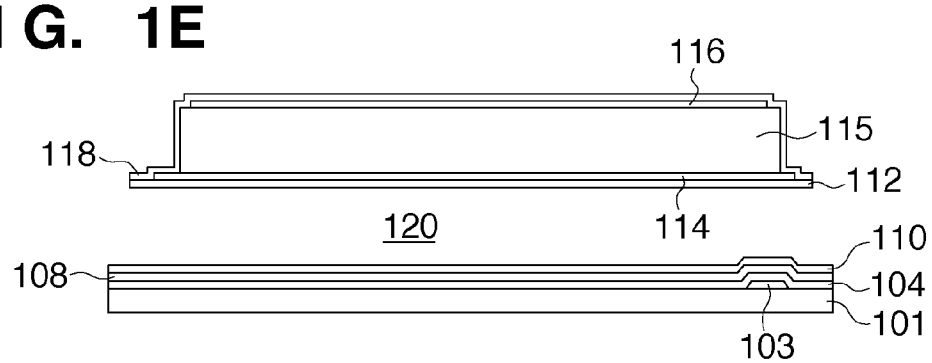

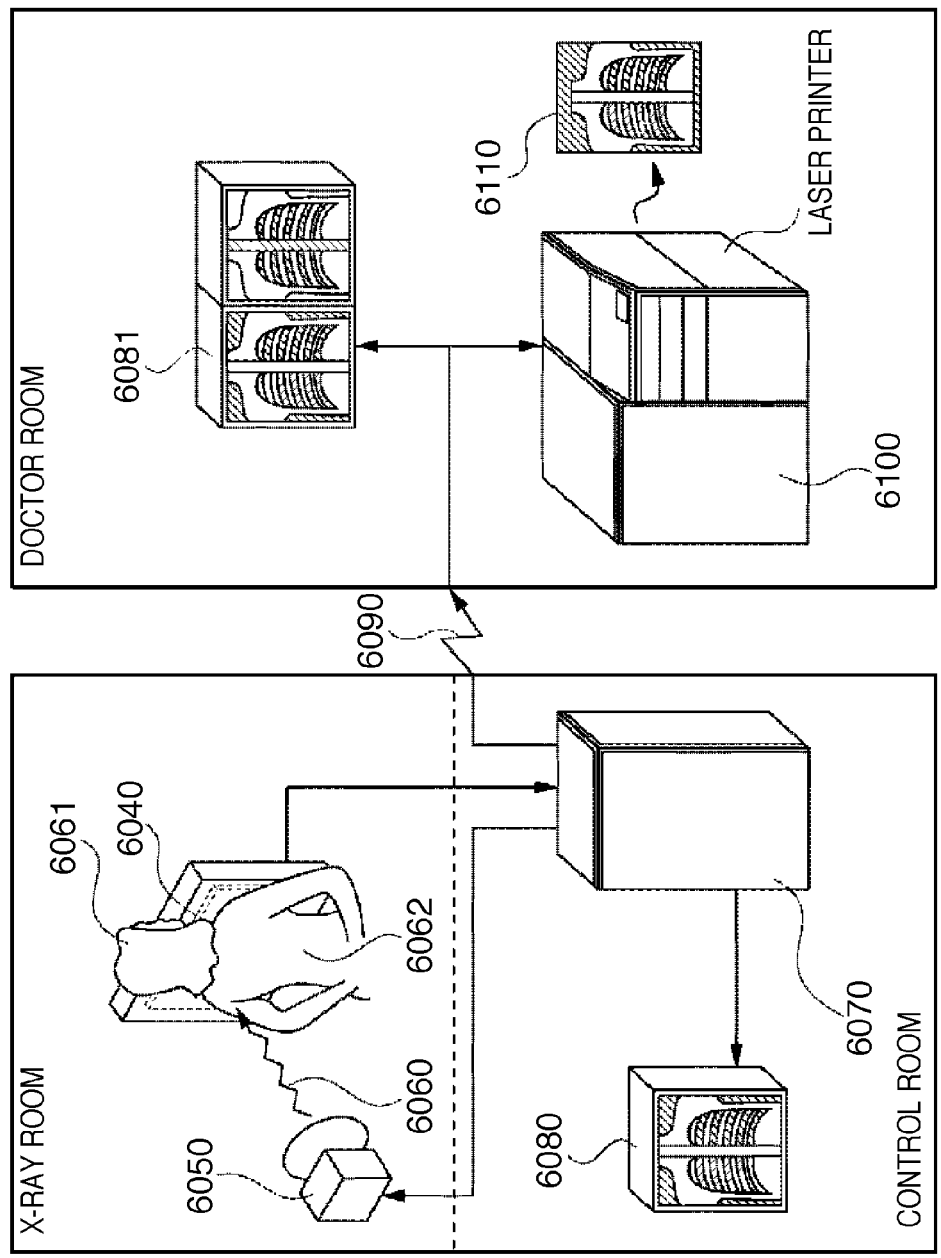

DETECTION APPARATUS, METHOD OF MANUFACTURING THE SAME, AND DETECTION SYSTEM

BACKGROUND OF THE INVENTION

1. Field of the Invention

The present invention relates to a detection apparatus, a method of manufacturing the same, and a detection system.

2. Description of the Related Art

Conventionally, a flat panel detector has been used, in which photodiodes that serve as conversion elements and TFTs that serve as switching elements are formed on the same layer. This arrangement, however, has reached the limitation of an increase in aperture ratio. With regard to this problem, U.S. Patent Application Publication No. 2003/0226974 has proposed a technique to increase the aperture ratio by electrically connecting the lower electrode of each photodiode to one of the two main electrodes of a corresponding TFT and stacking the photodiode and the TFT on each other. When each photodiode and a corresponding TFT are stacked on each other, a parasitic capacitance is generated between the lower electrode of the photodiode and a signal line electrically connected to the other of the two main electrodes of the TFT. A parasitic capacitance is also generated between the lower electrode of the photodiode and the other of the two main electrodes of the TFT. Furthermore, parasitic capacitances are generated between the lower electrode of the photodiode and the control electrode of the TFT and between the lower electrode of the photodiode and a control line electrically connected to the control electrode of the TFT. This increases the time constants associated with the control electrode, the control line, the other of the two main electrodes of the TFT, and the signal line, resulting in affecting the reading of electrical signals via signal lines. With regard to this problem, U.S. Patent Application Publication No. 2003/0226974 has proposed the use of benzocyclobutene having a low dielectric constant for an interlayer insulating layer between each photodiode and a corresponding switch TFT.

SUMMARY OF THE INVENTION

When a photodiode and a TFT are stacked on each other, it is preferable to reduce the interval between the photodiode and the TFT, in consideration of process easiness and stress on an interlayer insulating layer. However, when the interval between the photodiode and the TFT is reduced, the influence of parasitic capacitance described above increases. For this reason, it is desired to further decrease the dielectric constant between the photodiode and the TFT. According to one aspect of the present invention, therefore, in a detection apparatus including switching elements and conductive lines between a substrate and conversion elements, the parasitic capacitances generated between the conversion elements and the switching elements or the conductive lines are reduced.

The present invention in its first aspect provides a detection apparatus comprising: a substrate; a switching element arranged over the substrate and including a plurality of electrodes; a conductive line arranged over the substrate and electrically connected to a first electrode of the plurality of electrodes of the switching element; and a conversion element including a semiconductor layer arranged over the switching element and the conductive line and arranged between two electrodes, one electrode of the two electrodes being electrically connected to a second electrode of the plurality of electrodes of the switching element, the second electrode being different from the first electrode, wherein the one electrode of the conversion element is arranged over the switching element and the conductive line through a space formed between the one electrode and the first electrode of the switching element or between the one electrode and the conductive line.

The present invention in its second aspect provides a detection system comprising: the detection apparatus described above; and a signal processing unit configured to process a signal obtained by the detection apparatus.

The present invention in its third aspect provides a method of manufacturing a detection apparatus, the method comprising: forming a film covering a switching element and a conductive line arranged over a substrate, wherein the switching element includes a plurality of electrodes, and the conductive line is electrically connected to a first electrode of the plurality of electrodes; forming a conversion element over the switching element and the conductive line via the film, wherein the conversion element includes a semiconductor layer between two electrodes, and one electrode of the two electrodes is electrically connected to a second electrode of the plurality of electrodes of the switching element, the second electrode being different from the first electrode; and forming a space between the one electrode of the conversion element and the first electrode of the switching element or between the one electrode of the conversion element and the conductive line by removing at least part of the film.

Further features of the present invention will become apparent from the following description of exemplary embodiments (with reference to the attached drawings).

BRIEF DESCRIPTION OF THE DRAWINGS

FIGS. 1A to 1E are views that explain an exemplary arrangement of a detection apparatus 100 according to the first embodiment;

FIG. 10 is a view that explains an exemplary detection system using the detection apparatus according to each embodiment.

DESCRIPTION OF THE EMBODIMENTS

The embodiments of the present invention will be described below with reference to the accompanying drawings.

First Embodiment

Figure 1A:
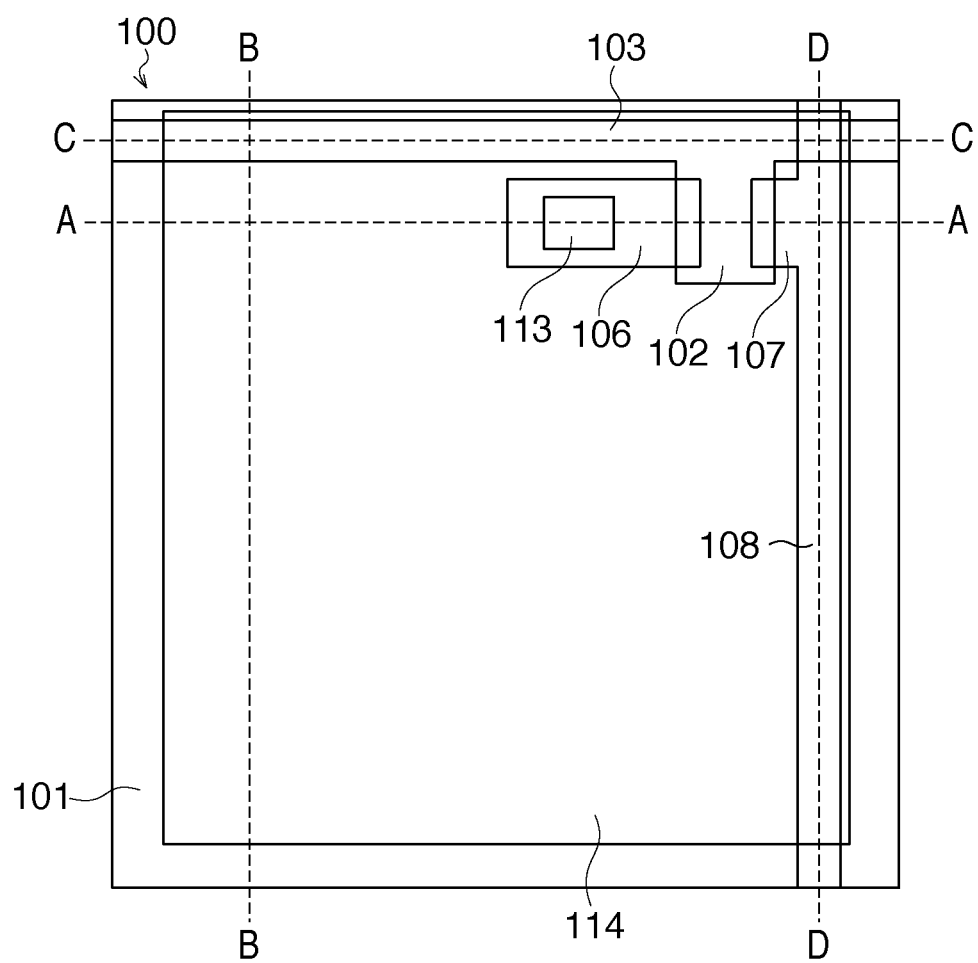

This embodiment exemplifies a case in which the present invention is applied to a photoelectric conversion element using a PIN photodiode. An example of the arrangement of a detection apparatus 100 according to the embodiment will be described with reference to FIGS. 1A to 1E. FIG. 1A is a plan view of the detection apparatus 100 including a plurality of pixels, with attention being paid to one pixel. FIG. 1B is a schematic sectional view of the pixel taken along a line A-A. FIG. 1C is a schematic sectional view taken along a line B-B. FIG. 1D is a schematic sectional view of the pixel taken along a line C-C. FIG. 1E is a schematic sectional view taken along a line D-D. For the sake of viewability, FIG. 1A shows only partial components.

The detection apparatus 100 includes transistors 109 as switching elements and photoelectric conversion elements 117 as conversion elements. Each transistor 109 formed over a substrate 101 is arranged between the corresponding photoelectric conversion element 117 and the substrate 101. The transistor 109 includes a gate electrode (control electrode) 102, a gate insulating film 104, a first semiconductor layer 105, a source electrode (one of the main electrodes) 106, and a drain electrode (the other of the main electrodes) 107. The photoelectric conversion element 117 includes a lower electrode (one electrode) 114, a PIN-type second semiconductor layer 115, and an upper electrode (the other electrode) 116. The lower electrode 114 is electrically connected to the source electrode 106. The gate electrode 102 is electrically connected to a gate line (control line) 103. The drain electrode 107 is electrically connected to a signal line 108. The upper electrode 116 is also electrically connected to a bias line (not shown). In the second semiconductor layer 115, incident light is converted into charge. When a voltage is applied to the gate electrode 102 via the gate line 103, an electrical signal corresponding to the charge is output to the signal line 108 via the transistor 109. The transistor 109, the gate line 103, and the signal line 108 are located at positions where they overlap the photoelectric conversion element 117. That is, the photoelectric conversion element 117 is located over the substrate 101 and is arranged over the gate line 103, the signal line 108, and the transistor 109.

A first protective film 110 covers the transistor 109 except for a portion connected to the lower electrode 114. The upper surface of a second protective film 112 is in contact with the lower surface of the photoelectric conversion element 117 except for a portion connected to the transistor 109. A third protective film 118 covers the upper and side surfaces of the photoelectric conversion element 117. The first and second protective films 110 and 112 are in contact with each other around the connected portion between the lower electrode 114 and the source electrode 106. The second and third protective films 112 and 118 are in contact with each other around the side surfaces of the photoelectric conversion element 117. That is, the first, second, and third protective films 110, 112, and 118 enclose the transistor 109 and the photoelectric conversion element 117.

A space 120 is formed between the first protective film 110 and the second protective film 112. The space 120 is generally formed by an air layer, but may be mixed with a gas generated in the process of manufacturing the detection apparatus 100 or may be a vacuum. With this arrangement, in the detection apparatus 100, the space 120 exists in at least part of the intervals between the lower electrode 114 and the gate line 103 and between the lower electrode 114 and the signal line 108. In addition, the space 120 exists in at least part of the intervals between the lower electrode 114 and the gate electrode 102 and between the lower electrode 114 and the drain electrode 107. That is, the lower electrode 114 is arranged over the transistor 109 and the signal line 108 through the space 120 between the lower electrode 114 and the drain electrode 107 or the signal line 108. The lower electrode 114 is arranged over the transistor 109 and the gate line 103 through the space 120 between the lower electrode 114 and the gate electrode 102 or the gate line 103. This makes it possible to reduce parasitic capacitances between the lower electrode 114 and the electrodes of the transistor 109 (the gate and drain electrodes in FIGS. 1A to 1E) and between the lower electrode 114 and the conductive lines (the gate and signal lines in FIGS. 1A to 1E).

An example of a method of manufacturing the detection apparatus 100 according to this embodiment will be described next with reference to FIGS. 2A to 2C. Although FIGS. 2A to 2C explain the manufacturing steps with reference to the schematic sectional view taken along the line A-A in FIG. 1A, other pixels are manufactured in the same steps.

Figure 2A:
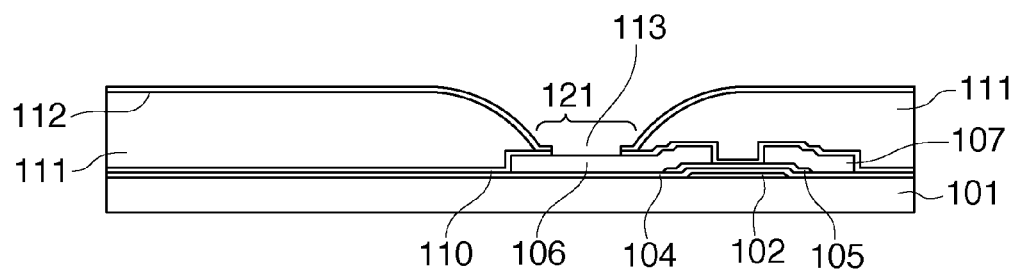
FIGS. 2A to 2C are views that explain an exemplary method of manufacturing the detection apparatus 100 according to the first embodiment.

First of all, as shown in FIG. 2A, a metallic thin film is deposited on the substrate 101 and patterned by the photolithography method or the like to form the gate electrode 102 and the gate line 103. The substrate 101 is formed from, for example, glass, and the metallic thin film is formed from, for example, Al. Subsequently, the gate insulating film 104 is formed on the gate electrode 102 by the plasma CVD method or the like. The gate insulating film 104 is formed from, for example, silicon nitride. Subsequently, the first semiconductor layer 105 is formed to cover the gate electrode 102 by the plasma CVD method or the like. The first semiconductor layer 105 is formed from, for example, amorphous silicon. A metallic thin film is then deposited on the first semiconductor layer 105 and patterned by the photolithography method or the like to form the source electrode 106, the drain electrode 107, and the signal line 108. With the above process, the transistor 109 is formed.

Subsequently, the first protective film 110 is deposited on the source electrode 106, the drain electrode 107, and the signal line 108 by the plasma CVD method or the like. The first protective film 110 is formed from, for example, silicon nitride. The thickness of the first protective film 110 can be, for example, 300 nm or more. An interlayer insulating film 111 is formed on the first protective film 110 by coating such as spray coating or spin coating. With this process, the interlayer insulating film 111 is formed to cover the gate line 103, the signal line 108, and the transistor 109. The interlayer insulating film 111 is formed from an organic resin such as acrylic resin which has a heatproof temperature of 200° C. or more. The thickness of the interlayer insulating film 111 can be, for example, 300 nm or more. The thickness of the interlayer insulating film 111 may be, for example, 10 μm or less or 6 μm or less. Subsequently, the interlayer insulating film 111 is patterned to expose part of the first protective film 110 on the source electrode 106. Since the first protective film 110 and the interlayer insulating film 111 are formed from different materials, it is possible to remove only the interlayer insulating film 111 on the first protective film 110 without removing the first protective film 110. The second protective film 112 is then deposited on the resultant structure. The second protective film 112 is formed from, for example, silicon nitride. The thickness of the second protective film 112 can be, for example, 100 nm or more. As a result, the first protective film 110 comes into contact with the second protective film 112 over the source electrode 106. Subsequently, part of the source electrode 106 is exposed by continuously patterning part of an area 121 where the first protective film 110 is in contact with the second protective film 112. This forms a contact hole 113. Since the first protective film 110 and the second protective film 112 are formed from the same material, it is possible to continuously pattern these protective films. This patterning is performed to leave an outer circumferential portion of the area 121 where the first protective film 110 is in contact with the second protective film 112. This leaves part of the area 121, where the first protective film 110 is in contact with the second protective film 112, around the contact hole 113. That is, the interlayer insulating film 111 is packaged around the contact hole 113.

Figure 2B:
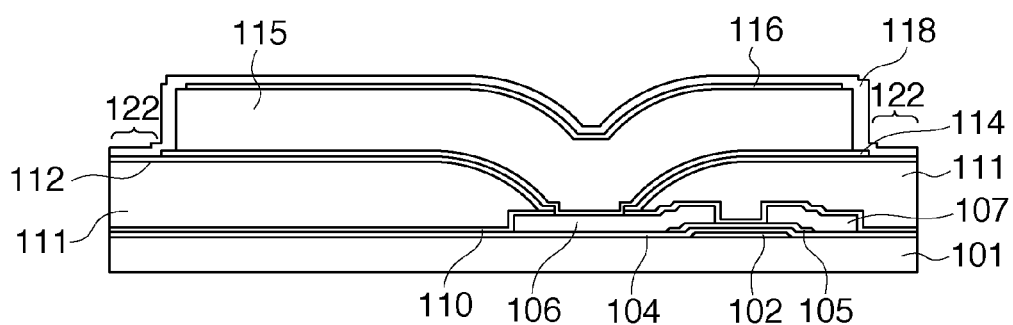

Subsequently, as shown in FIG. 2B, a metallic thin film is deposited on the second protective film 112 and the contact hole 113 by the sputtering method or the like and patterned by the photolithography method or the like to form the lower electrode 114. This patterning forms the lower electrode 114 partitioned for each pixel of the detection apparatus 100. As a result, part of the second protective film 112 is exposed between the lower electrode 114 of one pixel and the lower electrode of an adjacent pixel. Subsequently, the PIN-type second semiconductor layer 115 is formed by the plasma CVD method or the like so as to fit inside the lower electrode 114. If the step coverage with respect to the lower electrode 114 is good, the second semiconductor layer 115 may protrude from the lower electrode 114. In addition, a metallic thin film is deposited on the second semiconductor layer 115 by the sputtering method or the like and patterned so as to fit inside the second semiconductor layer 115, thereby forming the upper electrode 116. With the above process, the photoelectric conversion element 117 is formed. Subsequently, the third protective film 118 is deposited on the photoelectric conversion element 117 by the sputtering method or the like. The third protective film 118 is formed from, for example, silicon nitride. The thickness of the third protective film 118 can be, for example, 500 nm or more. As a result, the second protective film 112 is in contact with the third protective film 118 between adjacent pixels. That is, in this structure, the interlayer insulating film 111 is packaged around them.

Figure 2C:
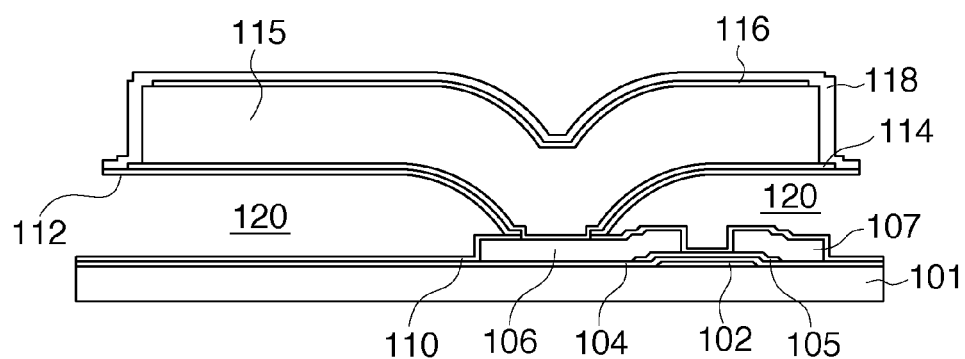

As shown in FIG. 2C, the interlayer insulating film 111 is exposed by continuously patterning part of an area 122 where the second protective film 112 is in contact with the third protective film 118. Since the second protective film 112 and the third protective film 118 are formed from the same material, it is possible to continuously pattern these protective films. This patterning is performed to leave an outer circumferential portion of the area 122 where the second protective film 112 is in contact with the third protective film 118. This leaves part of the area 122, where the second protective film 112 is in contact with the third protective film 118, around the side surfaces of the photoelectric conversion element 117. Subsequently, the interlayer insulating film 111 is removed by performing isotropic etching such as dry etching on the exposed interlayer insulating film 111, thereby forming the space 120. With the above process, the detection apparatus 100 according to this embodiment is manufactured. The dry etching on the interlayer insulating film 111 uses, for example, $O_2$. Dry etching on each protective film uses, for example, a fluorine-based gas such as $CF_4+O_2$. An etching gas is selected in accordance with the etching rate necessary for the formation of each film and the necessary shape of each film after etching.

According to the detection apparatus 100 of this embodiment, the parasitic capacitance generated between the photoelectric conversion element 117 and the transistor 109 is reduced. In addition, the parasitic capacitance generated between the photoelectric conversion element 117, the gate line, and the signal line is reduced.

The detection apparatus 100 according to this embodiment may have the following arrangements. A detection apparatus 300 shown in FIGS. 3A and 3B and a detection apparatus 400 shown in FIG. 4 will be described as modifications. The same reference numerals denote the same parts as in the detection apparatus 100 described with reference to FIGS. 1A to 1E, and a description of them will be omitted.

Figure 3A:
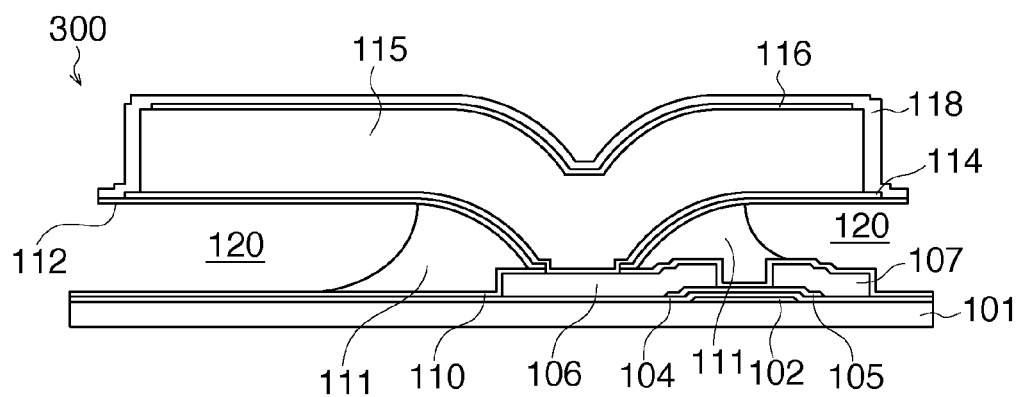
FIGS. 3A and 3B are views that explain a modification of the detection apparatus 100 according to the first embodiment.
Figure 3B:
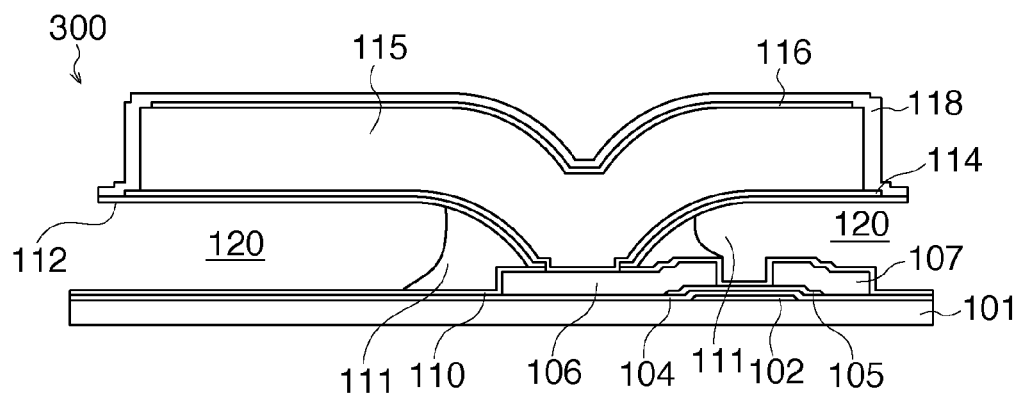
Figure 4:
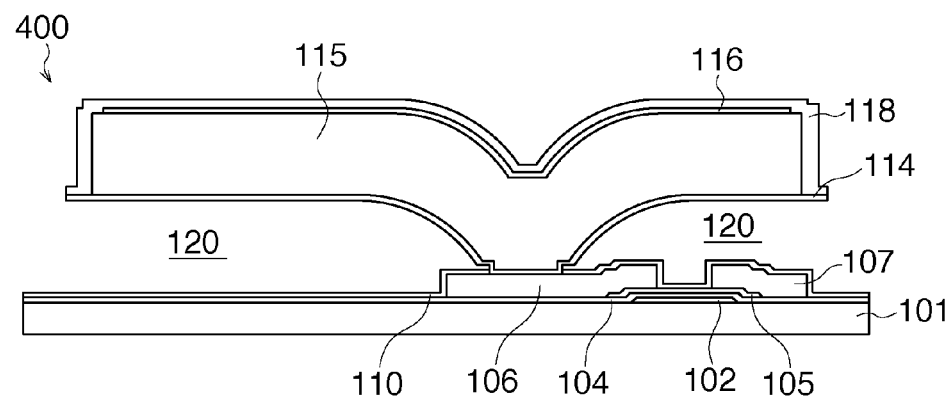
FIG. 4 is a view that explains a modification of the detection apparatus 100 according to the first embodiment.

The detection apparatus 300 shown in FIGS. 3A and 3B does not completely remove the interlayer insulating film 111 but leaves part of it. Referring to FIG. 3A, etching ends when the space 120 is formed in at least part of the intervals between the lower electrode 114 and the gate line 103 and between the lower electrode 114 and the signal line 108. This makes it possible to reduce the parasitic capacitance with the gate line 103 and the signal line 108 and make the interlayer insulating film 111 left without being removed support the photoelectric conversion element 117. Referring to FIG. 3B, etching ends when the space 120 is formed in at least part of the intervals between the lower electrode 114 and the gate line 103, between the lower electrode 114 and the channel of the TFT, and between the lower electrode 114 and the signal line 108. It is possible to reduce the parasitic capacitance between the gate line 103, the channel of the TFT, and the signal line 108 and make the interlayer insulating film 111 left without being removed support the photoelectric conversion element 117.

The detection apparatus 400 does not use the second protective film 112. That is, the lower electrode 114 is in contact with the space 120. This can simplify the manufacturing process. In the detection apparatus 400, the lower electrode 114 may be formed from a material with environmental stability. For example, the lower electrode 114 is formed from indium tin oxide (ITO). In addition, the detection apparatus 400 can also be configured to leave part of the interlayer insulating film 111 described with reference to FIG. 3A or 3B.

Figure 5:
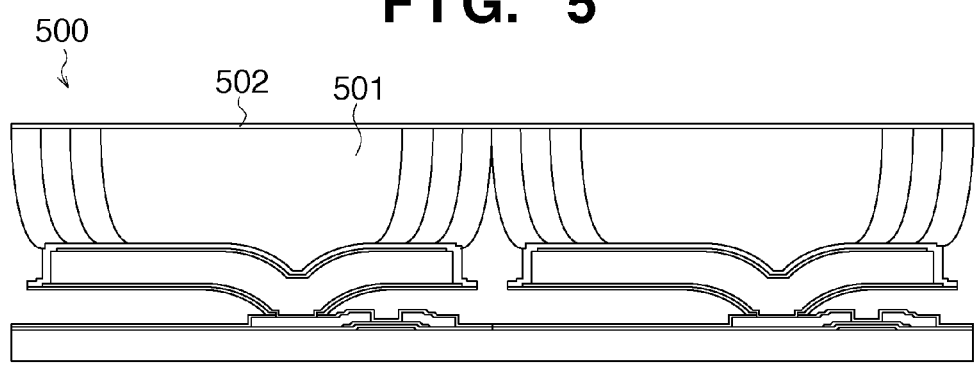
FIG. 5 is a view that explains a modification of the detection apparatus 100 according to the first embodiment.

Like a detection apparatus 500 shown in FIG. 5, each embodiment may stack a scintillator layer on the photoelectric conversion element 117 of each pixel. For a Tl-doped CsI columnar crystal 501 is deposited on the photoelectric conversion element 117. A fourth protective film 502 covers the columnar crystal 501.

Although the method of forming the space 120 by removing the interlayer insulating film 111 has been described above, the present invention is not limited to this. It is possible to use any kind of film, for example, a conductive film, as long as it can be selectively removed after the formation of the photoelectric conversion element 117. For example, it is possible to use a conductive film in a structure in which it is packaged by the first and second protective films 110 and 112 around the contact hole 113. In addition, it is possible to remove the conductive film between the lower electrode 114 and each of the gate electrode 102, the gate line 103, the drain electrode 107, the signal line 108, and the channel. In contrast, the conductive film may remain between the drain electrode and the lower electrode 114. In consideration of process easiness and parasitic capacitance and stress in the overall apparatus, an interlayer insulating film using an organic resin may be selected.

Second Embodiment

Figure 6:
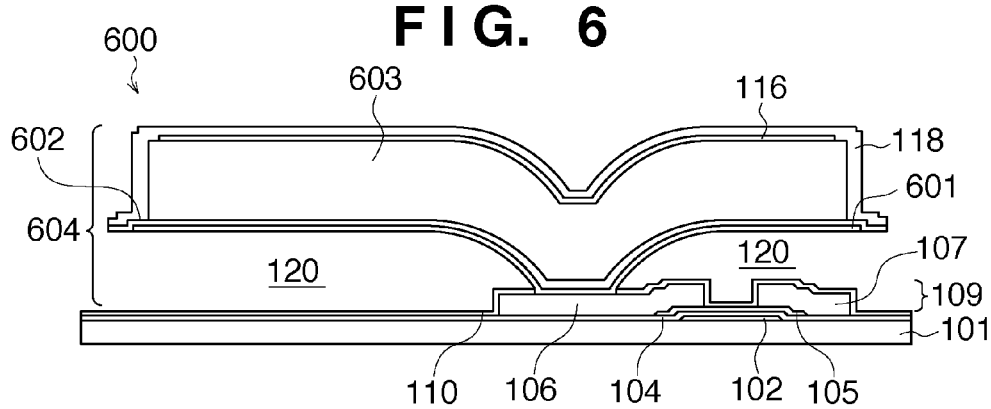
FIG. 6 is a view that explains an example of the arrangement of a detection apparatus 600 according to the second embodiment.

This embodiment exemplifies a case in which the present invention is applied to a photoelectric conversion element using a MIS-type photoelectric conversion element. An example of the arrangement of a detection apparatus 600 according to this embodiment will be described with reference to FIG. 6. FIG. 6 corresponds to FIG. 1B described in the first embodiment. The same reference numerals denote the same parts, and a description of them will be omitted.

A MIS-type photoelectric conversion element 604 includes a lower electrode 601, an insulating layer 602, and a second semiconductor layer 603. The lower electrode 601 is connected to a source electrode 106. An electrical signal converted by the MIS-type photoelectric conversion element 604 is output to a signal line 108 via a transistor 109. The insulating layer 602 is in contact with a third protective film 118 around the side surfaces of the second semiconductor layer 603.

In this embodiment as well, a space 120 exists in at least part of the intervals between the lower electrode 601 and a gate line 103 and between the lower electrode 601 and the signal line 108. In addition, the space 120 exists in at least part of the intervals between the lower electrode 601 and a gate electrode 102 and between the lower electrode 601 and a drain electrode 107. This makes it possible to reduce the parasitic capacitances between the lower electrode 601 and the electrodes of the transistor 109 and between the lower electrode 601 and the conductive lines.

Furthermore, each modification described in the first embodiment may be applied to the detection apparatus 600 described in the second embodiment.

Third Embodiment

An example of the arrangement of a detection apparatus 700 according to this embodiment which includes a plurality of pixels each including a MIS-type photoelectric conversion element as a photoelectric conversion element and a transistor as a switching element will be described with reference to FIGS. 7A to 7C. Each pixel in FIGS. 7A to 7C corresponds to the pixel in FIG. 6 described in the second embodiment. The same reference numerals denote the same parts, and a description of them will be omitted. The arrangement of a gate line 103 and a signal line 108 is the same as that shown in FIG. 1A.

Figure 7A:
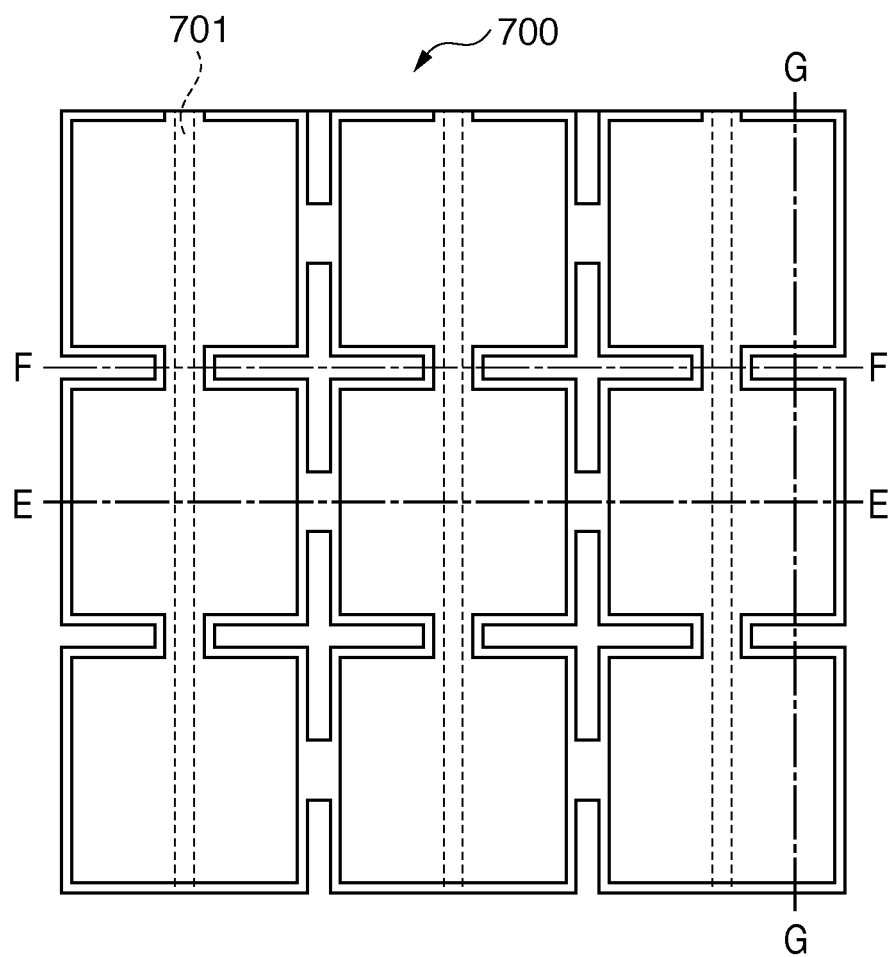
FIGS. 7A to 7C are views that explain an exemplary arrangement of a detection apparatus 700 according to the third embodiment.

FIG. 7A is a plan view of this embodiment. FIG. 7B is a sectional view taken along a line E-E in FIG. 7A. FIG. 7C is a sectional view taken along a line F-F in FIG. 7A. FIG. 7A shows a 3×3 pixel group as an example of a plurality of pixels. Note that, in practice, many pixels, for example, 2000×2000 pixels, are arranged.

Figure 7B:
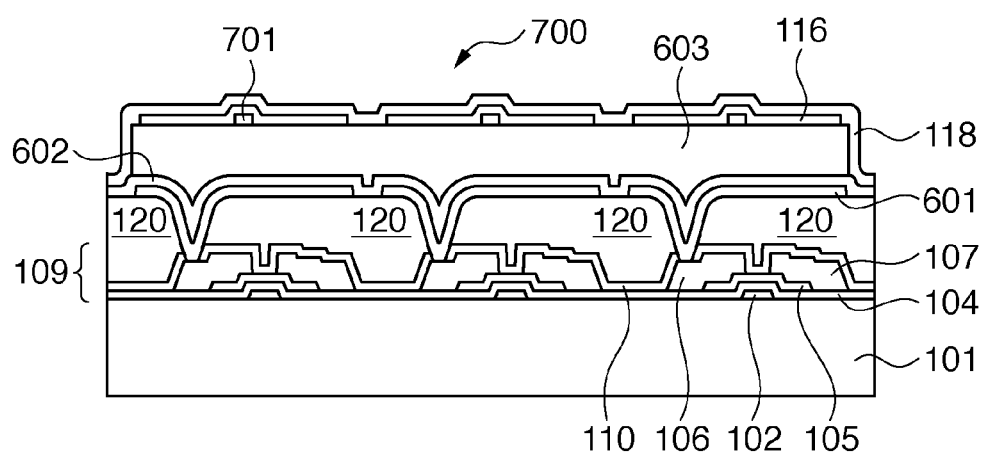
Figure 7C:
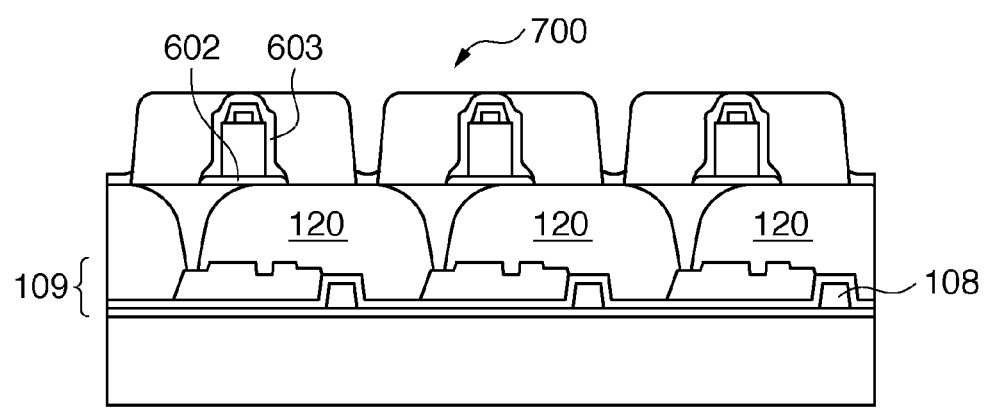

As shown in FIGS. 7A and 7B, the photoelectric conversion element of each pixel is partially coupled to other pixels, and insulating layers 602 and semiconductor layers 603 partly extend across a plurality of pixels. A third protective film 118 covers all the plurality of pixels. The detection apparatus according to this embodiment improves its mechanical strength with the above structure, thereby improving reliability.

In this embodiment as well, a space 120 exists in at least part of the intervals between a lower electrode 601 and the gate line 103 and between the lower electrode 601 and the signal line 108. In addition, the space 120 exists in at least part of the intervals between the lower electrode 601 and a gate electrode 102 and between the lower electrode 601 and a drain electrode 107. This makes it possible to reduce the parasitic capacitances between the lower electrode 601 and the electrodes of a transistor 109 and between the lower electrode 601 and the conductive lines.

In addition, each modification described in the first embodiment may be applied to the detection apparatus 700 described in this embodiment.

Fourth Embodiment

Figure 8A:
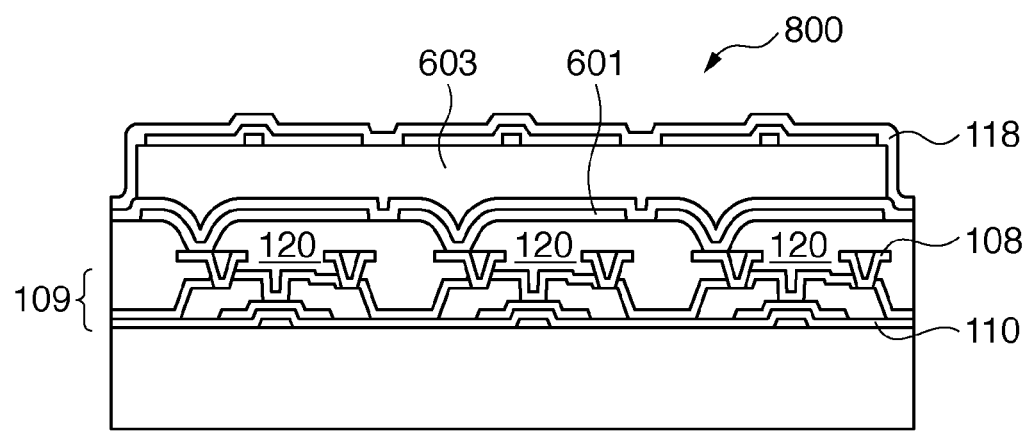
FIGS. 8A and 8B are views that explain an exemplary arrangement of a detection apparatus 800 according to the fourth embodiment.
Figure 8B:
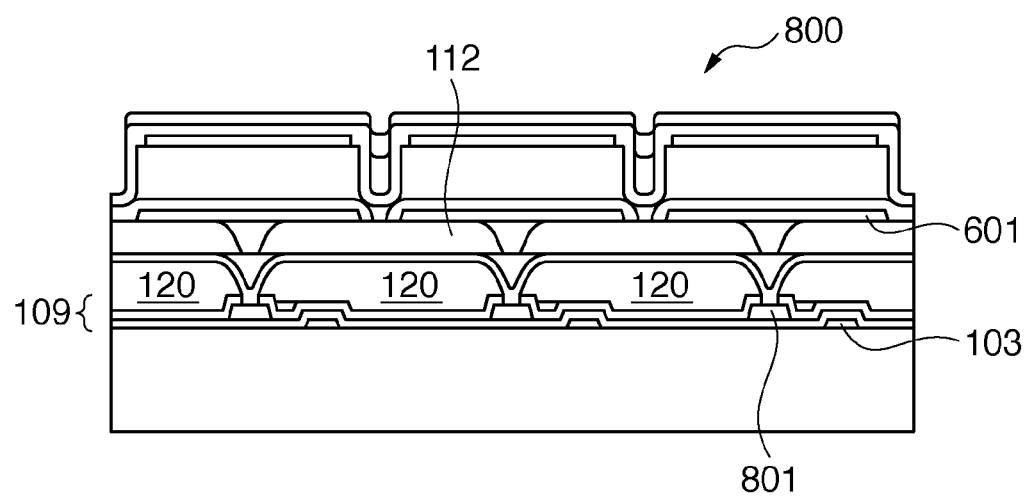

This embodiment is a modification of the detection apparatus according to the third embodiment. An example of the arrangement of a detection apparatus 800 according to this embodiment which includes a plurality of pixels each including a MIS-type photoelectric conversion element as a photoelectric conversion element and a transistor as a switching element will be described below with reference to FIGS. 8A and 8B. FIG. 8A is a sectional view taken along a line E-E in FIG. 7A. FIG. 8B is a sectional view taken along a line G-G in FIG. 7A.

As shown in FIGS. 8A and 8B, a signal line 108 is arranged in a space 120 between a photoelectric conversion element and a transistor 109, and has a support portion connected to a conductive portion 801 partly extending from the transistor 109. The space 120 exists in at least part of each of the intervals between a lower electrode 601, a gate line 103, and the signal line 108. The space 120 also exists in at least part of the intervals between the lower electrode 601 and a gate electrode 102 and between the lower electrode 601 and a drain electrode 107. This makes it possible to reduce the parasitic capacitances between the lower electrode 601 and the electrodes of the transistor 109 and between the lower electrode 601 and the conductive lines. This can reduce the parasitic capacitance with the conductive lines, that is, the gate line 103 and the signal line 108.

The following is a description of a process of connecting a transistor to a photoelectric conversion element, in a method of manufacturing the detection apparatus 800, which is different from the above manufacturing process. After the formation of the transistor 109, a first protective film 110 is formed, and a first interlayer insulating film (not shown) is formed. A contact opening is formed in the first protective film 110 and the first interlayer insulating film. A conductive portion to connect the signal line 108, the lower electrode of the photoelectric conversion element, and the transistor 109 is formed. The second interlayer insulating film (not shown) is formed on the first interlayer insulating film and the conductive portion. A contact opening is formed in the second interlayer insulating film. As shown in FIGS. 8A and 8B, this process forms two-level contact portions to connect the transistor to the photoelectric conversion element.

In addition, a third protective film 118 covering the photoelectric conversion element improves the reliability. Placing a second protective film 112 on the transistor 109 side of the lower electrode 601 can further improve the reliability. As a photoelectric conversion element, a MIS- or PIN-type photoelectric conversion element can be used.

Each modification described in the first embodiment may be applied to the detection apparatus 800 described in the fourth embodiment.

Fifth Embodiment

This embodiment is a detection apparatus configured to make each photoelectric conversion element extends in the placing direction of a bias line to further improve the mechanical strength and reduce the resistance of the bias line.

Figure 9:
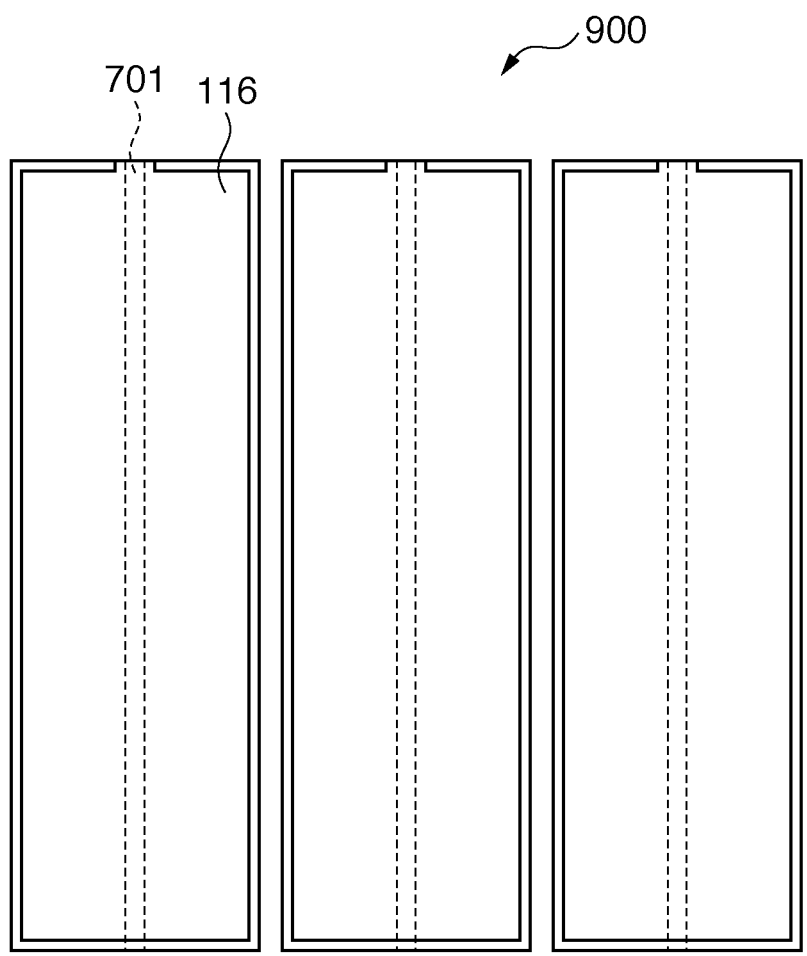
FIG. 9 is a view that explains an exemplary arrangement of a detection apparatus 900 according to the fifth embodiment.

FIG. 9 is a plan view of a detection apparatus 900 including a 3×3 pixel group as an example, in which each photoelectric conversion element extends in the placing direction of a bias line 701. In the case of a PIN-type photoelectric conversion element, a semiconductor layer and an upper electrode 116 extend in the placing direction of the bias line 701. Although not shown, a third protective film 118 extends in a similar manner.

This structure can improve the mechanical strength by coupling the respective pixels and reduce the resistance of each bias line. Reducing the resistance of each bias line can increase the driving speed of the detection apparatus, thereby improving image quality.

Each modification described in the first embodiment may be applied to the detection apparatus 900 described in the fifth embodiment.

Other Embodiments

FIG. 10 is a view showing an example of the application of the detection apparatus for radiation according to the present invention to an X-ray diagnostic system (radiation detection system). An X-ray 6060 as radiation generated by an X-ray tube 6050 (radiation source) is transmitted through a chest portion 6062 of an object to be examined or a patient 6061, and strikes a detection apparatus 6040 obtained by placing a scintillator including the columnar crystal 501 on the detection apparatus of the present invention. In this case, a detection conversion apparatus having a scintillator arranged on it forms a detection apparatus for radiation. This incident X-ray includes information inside the body of the patient 6061. The scintillator emits light in response to the incidence of X-rays, and photoelectrically converts the light, thereby obtaining electrical information. This information is converted into a digital signal. An image processor 6070 as a signal processing unit performs image processing of the information. The operator can observe the information on a display 6080 as a display unit in a control room. Note that the radiation detection system includes at least a detection apparatus and a signal processing unit to process a signal from the detection apparatus.

It is possible to transfer this information to a remote place via a transmission processing unit such as a telephone line 6090 or the like. A display 6081 serving as a display unit in a doctor room in a different place can display the information. Alternatively, a recording unit such as an optical disk can store the information. This allows a doctor in a remote place to perform diagnosis. In addition, a film processor 6100 as a recording unit can record the information on a film 6110 as a recording medium.

The above description has exemplified the detection apparatus using photoelectric conversion elements as conversion elements and the detection apparatus for radiation which uses units each including a photoelectric conversion element as a conversion element and a scintillator. However, the present invention is not limited to this. A detection apparatus for radiation may use conversion elements which directly convert radiation into charge. Each conversion element to directly convert radiation into charge can be formed by using the second semiconductor layer to convert incident radiation into charge in place of the second semiconductor layer 115 or the second semiconductor layer 603 which converts incident light into charge.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-092626, filed Apr. 13, 2010, and No. 2011-029087, filed Feb. 14, 2011, which are hereby incorporated by reference herein in their entirety.

What is claimed is:
1. A detection apparatus comprising:
a substrate;
a switching element arranged over the substrate and including a plurality of electrodes;
a conductive line arranged over the substrate and electrically connected to a first electrode of the plurality of electrodes of the switching element; and
a conversion element including a semiconductor layer arranged over the switching element and the conductive line and arranged between two electrodes, one electrode of the two electrodes being electrically connected to a second electrode of the plurality of electrodes of the switching element, the second electrode being different from the first electrode,
wherein the one electrode of the conversion element is arranged over the switching element and the conductive line through a space formed between the one electrode and the first electrode of the switching element or between the one electrode and the conductive line by removing at least part of a film covering the conductive line and the switching element.

2. The apparatus according to claim 1, wherein the space includes at least one of air, air mixed with a gas, or a vacuum.

3. The apparatus according to claim 2, wherein the film includes an interlayer insulating film.

4. The apparatus according to claim 1, further comprising a first protective film arranged between the space and the conductive line, a second protective film arranged between the one electrode of the conversion element and the space, and a third protective film arranged to cover an upper surface and a side surface of the conversion element,
wherein the second protective film and the third protective film are in contact with each other around the side surface of the conversion element.

5. The apparatus according to claim 1, further comprising a first protective film arranged between the space and the conductive line,
wherein the one electrode of the conversion element is in contact with the space, and formed from indium tin oxide.

6. The apparatus according to claim 1, wherein the conversion element includes a PIN-type or MIS-type photoelectric conversion element.

7. The apparatus according to claim 6, wherein the conversion element includes a scintillator arranged over the photoelectric conversion element.

8. The apparatus according to claim 1, wherein the switching element comprises a transistor, the first electrode of the switching element comprises a control electrode, and the conductive line comprises a control line.

9. The apparatus according to claim 1, wherein the switching element comprises a transistor, the first electrode of the switching element comprises one of main electrodes of the transistor, and the conductive line comprises a signal line.

10. A detection system comprising:
a detection apparatus according to claim 1; and
a signal processing unit configured to process a signal obtained by the detection apparatus.

11. A method of manufacturing a detection apparatus, the method comprising:
forming a film covering a switching element and a conductive line arranged over a substrate, wherein the switching element includes a plurality of electrodes, and the conductive line is electrically connected to a first electrode of the plurality of electrodes;
forming a conversion element over the switching element and the conductive line via the film, wherein the conversion element includes a semiconductor layer between two electrodes, and one electrode of the two electrodes is electrically connected to a second electrode of the plurality of electrodes of the switching element, the second electrode being different from the first electrode; and forming a space between the one electrode of the conversion element and the first electrode of the switching element or between the one electrode of the conversion element and the conductive line by removing at least part of the film.

* * * * *